(12) United States Patent
Frey

(10) Patent No.: US 8,207,009 B2
(45) Date of Patent: Jun. 26, 2012

(54) METHODS OF TEMPORALLY VARYING THE LASER INTENSITY DURING SCRIBING A PHOTOVOLTAIC DEVICE

(75) Inventor: Jonathan Mack Frey, Denver, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 0 days.

(21) Appl. No.: 13/089,797

(22) Filed: Apr. 19, 2011

(65) Prior Publication Data
US 2012/0028404 A1    Feb. 2, 2012

(51) Int. Cl.
*H01L 21/00* (2006.01)
(52) U.S. Cl. ............ 438/80; 438/95; 438/463; 438/102; 257/E31.008; 257/E31.029; 136/260; 136/264
(58) Field of Classification Search ............ 438/462, 438/463, 60, 68, 75, 95, 102, 113, 80; 136/260, 136/264; 257/E31.008, E31.029, E31.084
See application file for complete search history.

(56) References Cited

U.S. PATENT DOCUMENTS

| | | | |
|---|---|---|---|
| 6,077,722 A | 6/2000 | Janeen et al. | |
| 6,421,390 B1 | 7/2002 | Burkhart | |
| 6,621,613 B2 | 9/2003 | Silberberg et al. | |
| 6,882,456 B2 | 4/2005 | Mansbridge | |
| 6,913,943 B2 * | 7/2005 | Cunningham et al. | 438/57 |
| 7,057,788 B2 | 6/2006 | Ohbayashi et al. | |
| 7,105,811 B2 | 9/2006 | Dantus et al. | |
| 7,209,279 B2 | 4/2007 | Igasaki et al. | |
| 7,219,017 B2 | 5/2007 | Vitaliano et al. | |
| 7,230,715 B2 | 6/2007 | Li | |
| 7,439,497 B2 | 10/2008 | Dantus et al. | |
| 7,450,618 B2 | 11/2008 | Dantus et al. | |
| 7,486,704 B2 | 2/2009 | Kaplan et al. | |
| 7,567,596 B2 | 7/2009 | Dantus et al. | |
| 7,583,710 B2 | 9/2009 | Dantus et al. | |
| 7,609,731 B2 | 10/2009 | Dantus et al. | |
| 7,998,838 B2 * | 8/2011 | Rekow et al. | 438/460 |
| 2004/0009620 A1 | 1/2004 | Saito et al. | |
| 2004/0021926 A1 | 2/2004 | Mansbridge | |
| 2006/0119855 A1 | 6/2006 | Li | |
| 2009/0122819 A1 | 5/2009 | Dantus et al. | |
| 2009/0245301 A1 | 10/2009 | Peng et al. | |
| 2009/0323741 A1 | 12/2009 | Deladurantaye et al. | |
| 2011/0233177 A1 * | 9/2011 | Panarello et al. | 219/121.69 |

* cited by examiner

*Primary Examiner* — Julio J Maldonado
(74) *Attorney, Agent, or Firm* — Dority & Manning, P.A.

(57) ABSTRACT

Methods for laser scribing a film stack including a plurality of thin film layers on a substrate are provided. A pulse of a laser beam is applied to the film stack, where the laser beam has a power that varies as a function of time during the pulse according to a predetermined power cycle. For example, the pulse can have a pulse lasting about 0.1 nanoseconds to about 500 nanoseconds. This pulse of the laser beam can be repeated across the film stack to form a scribe line through at least one of the thin film layers on the substrate. Such methods are particularly useful in laser scribing a cadmium telluride thin-film based photovoltaic device.

19 Claims, 6 Drawing Sheets

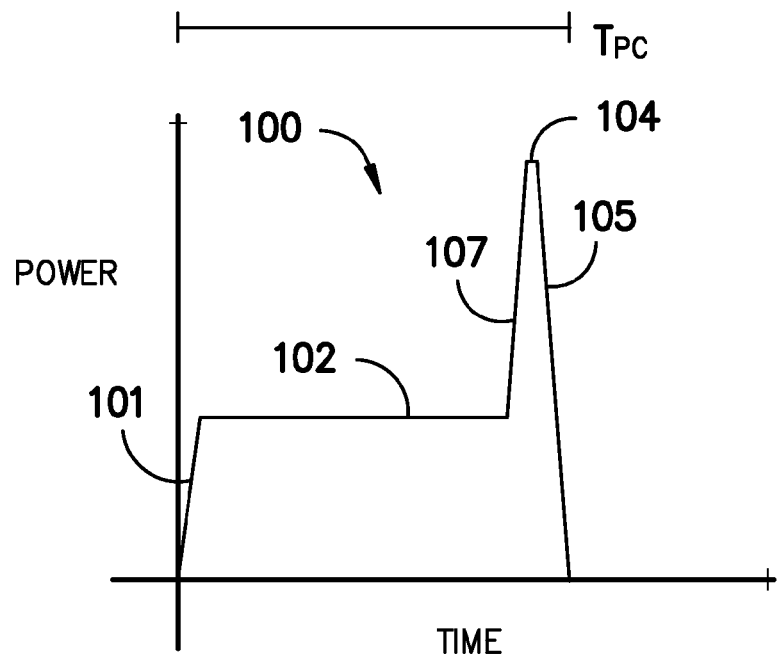
FIG. -1-
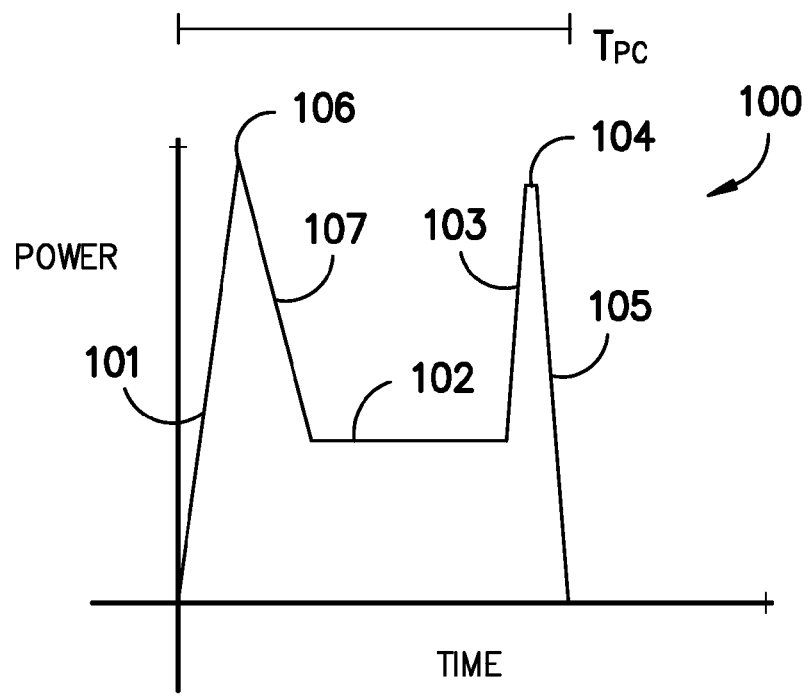
FIG. -2-

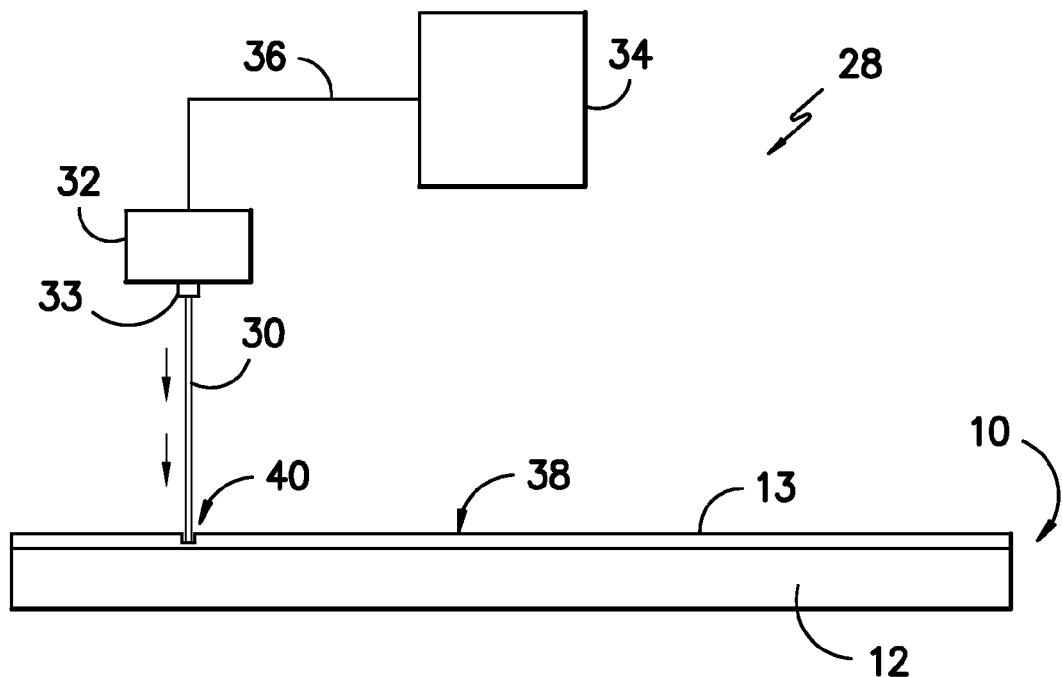
FIG. -3-
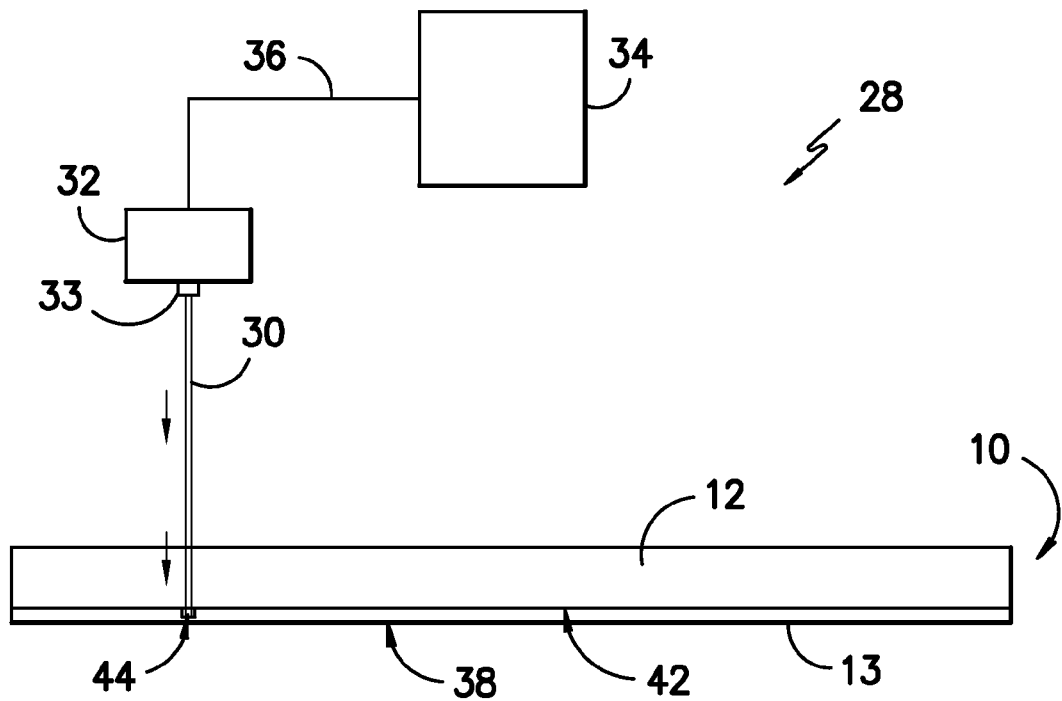
FIG. -4-

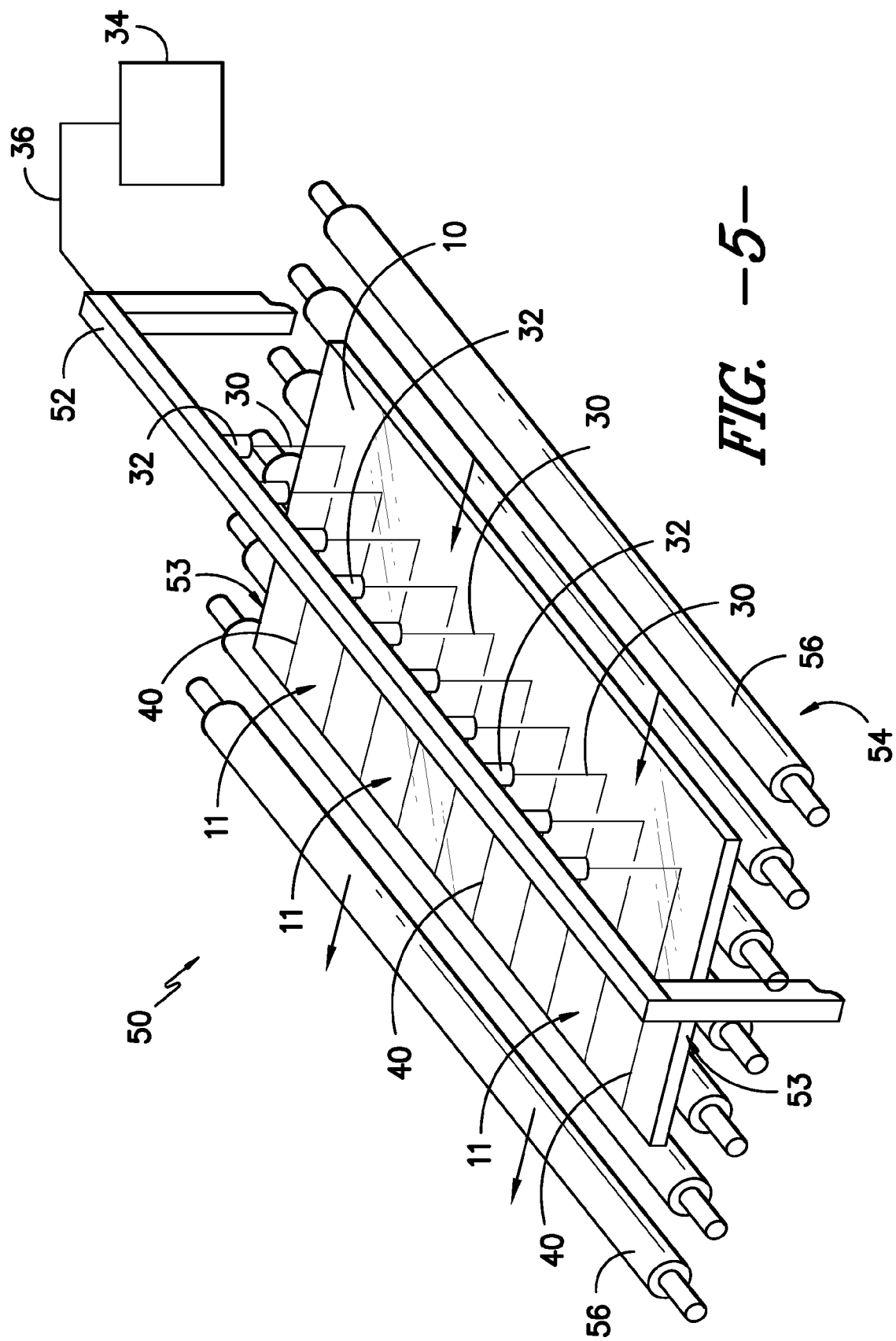

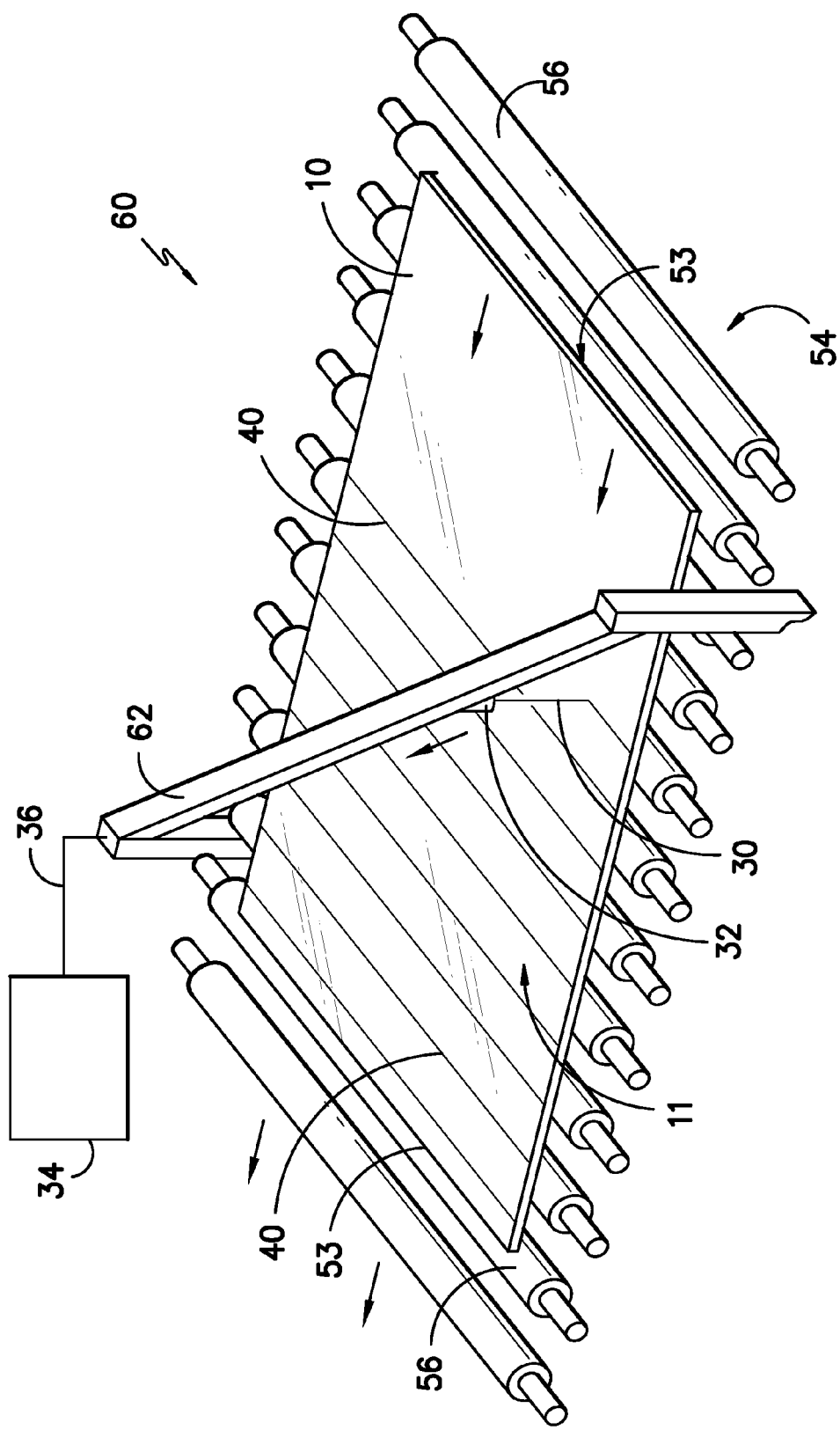
FIG. -6-

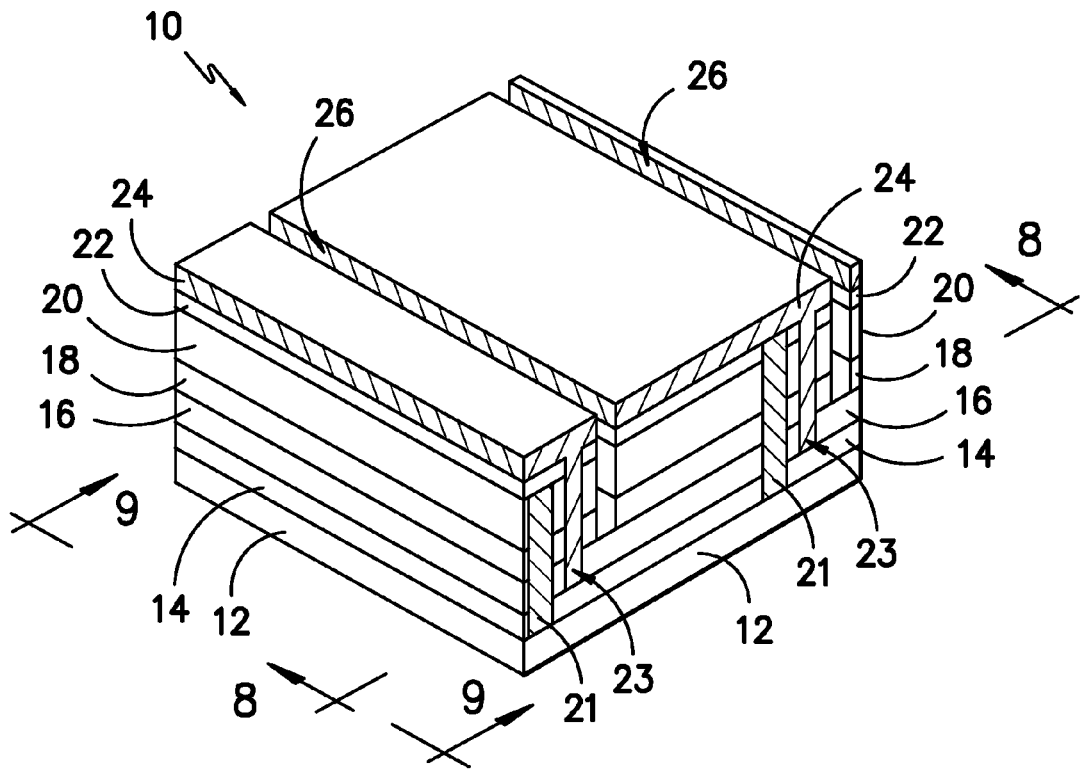
FIG. -7-
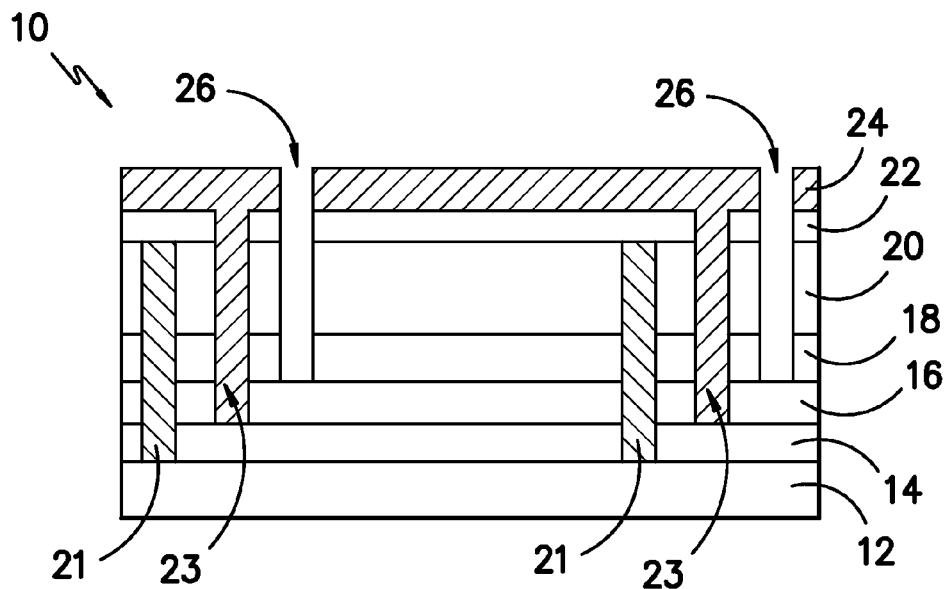
FIG. -8-

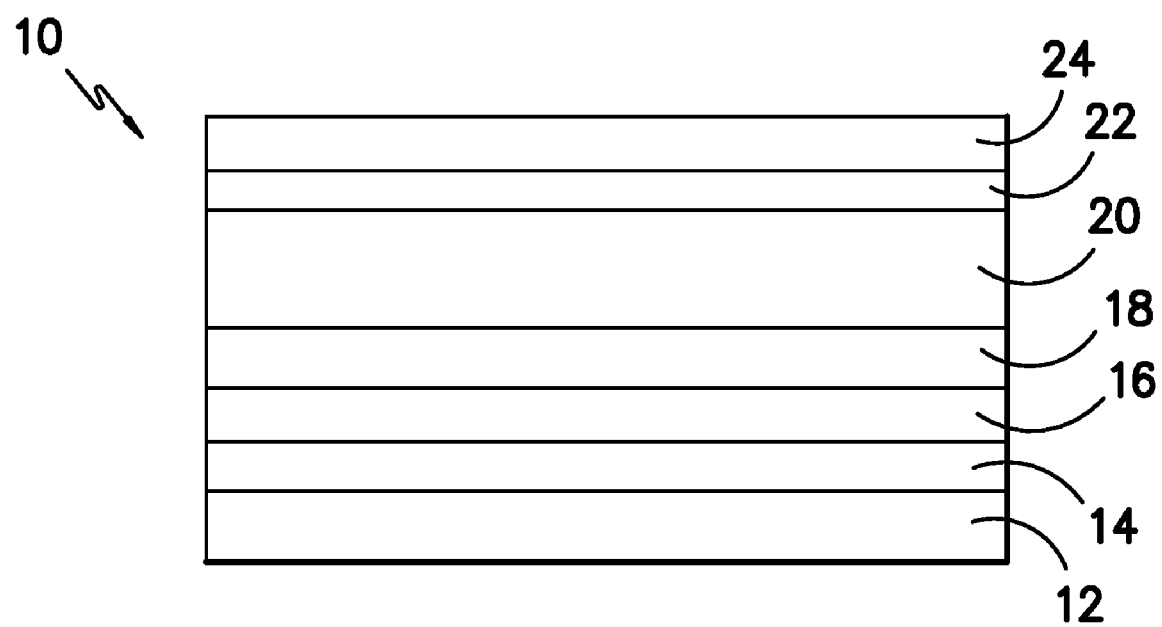
FIG. -9-

METHODS OF TEMPORALLY VARYING THE LASER INTENSITY DURING SCRIBING A PHOTOVOLTAIC DEVICE

FIELD OF THE INVENTION

The subject matter disclosed herein relates generally to the field of laser scribing a photovoltaic module to form individual cells in the module. More particularly, the subject matter is related to methods and apparatus for varying the intensity of a laser for scribing a cadmium telluride-based thin film photovoltaic (PV) device.

BACKGROUND OF THE INVENTION

Photovoltaic (PV) or solar cells are material junction devices which convert sunlight into direct current (DC) electrical power. When exposed to sunlight, the electric field of solar cell p-n junctions separates pairs of free electrons and holes, thus generating a photo-voltage. A circuit from n-side to p-side allows the flow of electrons when the solar cell is connected to an electrical load, while the area and other parameters of the PV cell junction device determine the available current. Electrical power is the product of the voltage times the current generated as the electrons and holes recombine.

Thin-film solar devices typically consist of multiple thin layers of material deposited on sheet glass. These glass panels are typically subdivided into a large number (between 100 and 200) of individual solar cells by scribing processes that also define the electrical interconnects for adjacent cells, which are electrically connected in series to produce power with a current. Laser scribing enables high-volume production of next-generation thin-film devices, and laser scribing ouTperforms mechanical scribing methods in quality, speed, and reliability.

The laser-material interaction involves complex processes of heating, melting, vaporization, ejection of atoms, ions and molecules, shock waves, plasma initiation and plasma expansion. The resulting crater and laser-induced plasma are dependent on the laser beam parameters (e.g., duration, energy, and wavelength), the solid target properties, and the surrounding environment's conditions.

The laser scribes are desirably controlled to a specific depth to control the properties of the individual cells and resulting module formed. However, due at least in part to the different material composition of each thin film, the energy (e.g., the intensity of the laser and/or the time applied) required to scribe each individual thin film layer in the film stack can vary. As such, accurately controlling the depth of the laser scribe can be a calculation based on the sum of the energy required to scribe each layer. This calculation can lead to variations in the depth of the laser scribe formed through the many layers. Such variations in depth can, in turn, lead to variations in performance of the resulting PV module.

As such, a need exists for more precisely laser scribing multiple thin films on a glass supersubstrate, especially cadmium telluride based thin film photovoltaic devices.

BRIEF DESCRIPTION OF THE INVENTION

Aspects and advantages of the invention will be set forth in part in the following description, or may be obvious from the description, or may be learned through practice of the invention.

Methods are generally disclosed for laser scribing a film stack including a plurality of thin film layers on a substrate. A pulse of a laser beam is applied to the film stack, where the laser beam has a power that varies as a function of time during the pulse to complete a predetermined power cycle. For example, the pulse can have a power cycle that lasts about 0.1 nanoseconds to about 500 nanoseconds. This pulse of the laser beam can be repeated across the film stack to form a scribe line through at least one of the thin film layers on the substrate.

Such methods are particularly useful in laser scribing a cadmium telluride thin-film based photovoltaic device. For example, a cadmium telluride thin-film based photovoltaic device can be provided that includes a glass superstrate and a film stack comprising a transparent conductive oxide layer over the glass superstrate, a resistive transparent buffer layer over the transparent conductive oxide layer, a cadmium sulfide layer over the resistive transparent buffer layer, and a cadmium telluride layer over the cadmium sulfide layer. The pulse of a laser beam can then be applied onto the film stack with a power that varies as a function of time during the pulse to complete a predetermined power cycle. The pulse of the laser beam can then be repeated across the cadmium telluride thin-film based photovoltaic device to form a scribe line in the film stack.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 shows an exemplary power cycle of a laser beam varying temporally;

FIG. 2 shows another exemplary power cycle of a laser beam varying temporally;

FIG. 3 shows an exemplary system for laser scribing thin films on a photovoltaic device;

FIG. 4 shows another exemplary system for laser scribing thin films on a photovoltaic device;

FIG. 5 shows an exemplary apparatus for simultaneously forming multiple scribe lines thin films on a photovoltaic device;

FIG. 6 shows another exemplary apparatus for forming multiple scribe lines on thin films on a photovoltaic device;

FIG. 7 shows a perspective view of an exemplary cadmium telluride thin film photovoltaic device;

FIG. 8 shows a general schematic of a cross-sectional view of the exemplary cadmium telluride thin film photovoltaic device of FIG. 7; and, FIG. 9 shows a general schematic of a cross-sectional view perpendicular to the view shown in FIG. 8 of the exemplary cadmium telluride thin film photovoltaic devices according to FIG. 7.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods are generally disclosed for laser scribing a film stack utilizing a laser pulse having a temporally varied power. Specifically, the laser beam has a power that varies as a function of time during each pulse according to a predetermined power cycle. The pulse can then be repeated across the surface of the film stack to form a scribe line through at least one of the thin film layers of the film stack. According to these methods, the accuracy of the laser scribing process through the thin films of the film stack can be enhanced, leading to improved quality (e.g., better uniformity) of the scribe lines formed. Additionally, the power level of the laser can be adjusted to match the properties of the individual thin films as the laser beam scribes through the thickness of the film stack.

The pulse can generally have a power cycle lasting about 0.1 nanoseconds (ns) to about 500 ns, such as about 0.5 ns to about 250 ns. In particular embodiment, the pulse can last about 1 ns to about 100 ns, such as about 5 ns to about 50 ns.

The power cycle of each pulse can define a plurality of power levels that are different from each other. As such, the power applied to the film stack can vary temporally (i.e., as a function of time) during each pulse. For example, FIG. 1 shows an exemplary power cycle 100 showing the variation of power (the y-axis) as a function of time (the x-axis). The power cycle 100 defines a first power level 102 that is different than a second power level 104. As used herein, the term "power level" refers to a line or a peak on the power cycle of the power of the laser beam during the pulse, where "a line" refers to a substantially constant power over a period of the pulse and "a peak" refers to a local maximum or minimum of the power of the laser beam during the pulse.

In the embodiment shown in FIG. 1, the first power level 102 is less than the second power level 104. For example, the second power level 104 can be about 10% to about 150% greater than the first power level 102 (i.e., the second power level 104 can be about 110% to about 250% of the first power level 102), such as about 50% to about 100% greater than the first power level 102 (i.e., the second power level 104 can be about 150% to about 200% of the first power level 102).

The power of the laser beam remains at the first power level 102 for a first duration (equivalent to the length of the power cycle 100 at the first power level 102), and the power of the laser beam remains at the second power level 104 for a second duration (equivalent to the length of the power cycle 100 at the second power level 102). In the embodiment of FIG. 1, the first duration of the first power level 102 is longer than the second duration of the second power level 104. For example, the first duration of the first power level 102 can be about 10% to about 5,000% greater than the second duration of the second power level 104 (i.e., the first duration can be about 110% to about 50,000% of the second duration), such as about 100% to about 1,000% greater than the second duration of the second power level 104 (i.e., the first duration can be about 1,000% to about 10,000% of the second duration).

In the embodiment shown in FIG. 1, the first power level 102 is sequentially before the second power level 104 in the power cycle 100 of the pulse Tp. However, in other embodiments, this sequence can be reversed such that the second power level 104 is sequentially before the first power level 102.

In certain embodiments, the power of the laser beam can remain at the first power level 102 for a first duration that is about 10% to about 90% of the pulse Tp, such as about 20% to about 75% of the pulse Tp, or more particularly about 25% to about 50% of the pulse Tp. Conversely, the power of the laser beam can remain at the second power level 104 for a second duration is about 0.5% to less than 50% of the pulse, such as about 1% to about 25% of the pulse. Of course, the first duration and second duration can be varied as desired.

FIG. 2 shows an alternative power cycle 100 that has a third power level 106 in addition to the first power level 102 and the second power level 104. The third power level 106 is different than both the first power level 102 and the second power level 104. As shown, the third power level 106 has a power that is greater than both the first power level 102 and the second power level 104, and the first power level is less than both the third power level and the second power level.

The third power level 106 of the power cycle 100 of FIG. 2 is defined by a peak in the power. Thus, the third duration of the third power level 106 in FIG. 2, as defined by the length of the third power level 106, is a fraction of the first duration. For example, the third duration can be less than 5% of the first duration, such as about 0.001% to about 1% of the first duration. However, in other embodiments, the third duration of the third power level can be adjusted as desired such that the power of the laser beam remains at the third power level for a third duration that can be about 0.01% to about 50% of the pulse, such as about for about 0.1% to about 25% of the pulse duration.

Additionally, FIG. 2 shows that the third power level 106 is sequentially before the first power level 102 in the power cycle 100 of the pulse $T_p$, and the first power level 102 is sequentially before the second power level 104 in the power cycle 100 of the pulse $T_p$. However, in other embodiments, this sequence can be changed to meet a power cycle desired for a particular application (e.g., depending on the nature of the film stack being scribed).

The transitions 101, 103, 105, 107 in power the flunctuation curve 100 of the pulse Tp can occur quickly with respect to the total duration of the pulse Tp, such each transition 101, 103, 105, 107 lasting less than about 1% of the pulse Tp (e.g., about 0.001% to about 0.1% of the pulse Tp).

FIG. 3 shows an exemplary system 28 and method of scribing a film stack 13 on a substrate 12 of a photovoltaic device 10 by directing a laser beam 30 onto the film stack 13 from a laser source 32. As shown in FIG. 3, the laser beam 30 is directly applied onto an exposed surface 38 of the film stack 13 to form a scribe line 40. FIG. 4 shows an alternative embodiment to the system 28 and method of FIG. 3, where the laser beam 30 passes through the glass substrate 12 to form a scribe line 44 on the inner surface 42 of the film stack 13 adjacent to the substrate 12. As stated, the depth of the scribe lines 40, 44 into the thickness of the film stack 13 can be adjusted according to the laser beam's intensity (as a function of the total power and pulse Tp).

The laser source 32 can be any suitable laser device that emits light (i.e., electromagnetic radiation) through optical amplification based on the stimulated emission of photon, as known in the art. The wavelength of the laser beam 30 can be adjusted as desired and can be monochromatic or multichromatic that is substantially constant or varying as a function of time with the power. For example, the wavelength of the laser beam 30 can be in a range of about 250 nm to about 1150 nm. Suitable monochromatic wavelengths of the laser beam 30 include, but are not limited to, about 266 nm, about 355 nm, about 532 nm, and about 1064 nm. Additionally, the laser beam 30 can be focused through a lens 33 in the laser source 32 to control the diameter of the laser beam 30, according to the desired size of the scribe lines 40 formed in the photovoltaic module 10. For example, the diameter of the laser beam 30 can be about 10 μm to about 500 μm in certain embodiments.

In both of the embodiments shown in FIGS. 3 and 4, the laser source 32 is connected to a computing device 34 via communication link 36 (e.g., a wired or wireless communication link). The computing device 34 is configured to control the power of the laser beam 30 from the laser source 32 according to the desired power cycle 100. Specifically, the computing device 34 includes memory having computer readable instructions stored in a computer readable medium for execution by a processor to control the power of the laser beam 30 from the laser source 32 according to the desired power cycle 100.

FIG. 5 shows an exemplary system 50 and method of simultaneously forming multiple scribe lines 40 in a photovoltaic device 10. A plurality of laser sources 32 are positioned along the frame 52. A photovoltaic device 10 is carried under the frame 52 and the plurality of laser sources 32 via a conveyor system 54. The photovoltaic device 10 moves in a direction that is substantially perpendicular to the orientation of the frame 52 such that the scribe lines 40 are oriented in substantially straight lines that are substantially parallel to the lateral side edges 53 of the photovoltaic device 10. Additionally, the conveyor system 54 is configured to move the photovoltaic device 10 at a substantially constant speed in order to ensure that the scribe lines 40 are substantially uniform in depth across the length of the scribe line 40.

FIG. 6 shows an alternative system 60 and method of forming multiple scribe lines 40 in a photovoltaic device 10. A laser source 32 is moveably mounted on the frame 62, which is oriented at an angle (e.g., about 10° to about 80°) in relation to the direction of travel of the photovoltaic device 10 (i.e., the device vector). During scribing, the laser source 32 is moved along the frame 62 such that its movement in the device vector is at substantially the same speed as the movement of the photovoltaic device 10. Thus, a scribe line 40 can be formed in the photovoltaic device 10 in a direction perpendicular to the device vector and substantially parallel to the lateral side edges 53.

Although shown utilizing rollers 56, the conveyor system 54 of FIGS. 5 and 6 can be any suitable carrying system (e.g., including a belt, track, etc.) configured to carry the photovoltaic device 10. The photovoltaic device 10 can be transported under the frame 52 with either of the film stack or the glass substrate directly exposed to the laser beam 30.

The laser sources 32 shown in FIGS. 5 and 6 are controlled via the computing device 34, as discussed with regards to FIGS. 3 and 4. As such, each laser source 32 can be pulsed according to a pulse Tp having a power cycle 100 as discussed above.

Thus, the systems 50 and 60 of FIGS. 5 and 6, respectively, can form a plurality of photovoltaic cells 11 separated by the scribe lines 40 in the photovoltaic device 10.

The pulsed laser beam, wherein each pulse varies the power of the laser beam according to a preset power cycle 100 as described above, can be particularly useful in forming scribe lines in a cadmium telluride based thin film photovoltaic device, such as shown in FIGS. 7-9. As shown, the cadmium telluride based thin-film photovoltaic device 10 includes a glass substrate 12, a TCO layer 14, a resistive transparent buffer layer 16, a cadmium sulfide layer 18, a cadmium telluride layer 20, a graphite layer 22, and a metal contact layer 24.

As stated, the photovoltaic device 10 generally includes a plurality of cells separated by scribe lines, generally formed via a laser scribing process, such as described above. For example, the laser scribing process can entail defining a first isolation scribe through the photo reactive layers (i.e., the cadmium sulfide layer 18 and the cadmium telluride layer 20) and underlying layers (i.e., through the TCO layer 14) down to the glass substrate 12. The first isolation scribe line 21 is then filled with dielectric material before application of the back contact layers in order to ensure that the TCO layer 14 is electrically isolated between cells. For example, the first isolation scribe 21 can be filled using a photoresist development process wherein a liquid negative photoresist (NPR) material is coated onto the cadmium telluride layer 20 by spraying, roll coating, screen printing, or any other suitable application process. The substrate 12 is then exposed to light from below such that the NPR material in the first isolation scribes 21 (and any pinholes in the cadmium telluride material 20) are exposed to the light, causing the exposed NPR polymers to crosslink and "harden." The substrate 12 is then "developed" in a process wherein a chemical developer is applied to the cadmium telluride layer 20 to dissolve any unhardened NPR material. In other words, the NPR material that was not exposed to the light is washed away from the cadmium telluride layer 20 by the developer, leaving the first isolation scribes 21 filled with the NPR material.

A series connecting scribe 23 can be laser cut through the graphite layer 22 to the TCO layer 14 and filled with the conductive metallic material of the metal contact layer 24 to electrically connect adjacent cells to each other in series. Of course, any conductive material can be included in the series connecting scribes 23. Specifically, the series connecting scribe 23 can allow the metal contact layer 24 to contact the TCO layer 14 providing a direct electrical connection between the back contact (i.e., the graphite layer 22 and the metal contact layer 24) and the front contact material (i.e., the TCO layer 14).

Finally, a second isolation scribe 26 can be laser cut through the back contact (i.e., the graphite layer 22 and the metal contact layer 24) and photo reactive layers (i.e., the cadmium sulfide layer 18 and the cadmium telluride layer 20) to isolate the back contact into individual cells.

The laser scribing processes can be utilized to form any of these scribe lines. For example, when forming the second isolation scribe 26, a power cycle 100 as shown in FIG. 1 may be useful to first scribe the graphite layer 22 using the first power level 102 and then scribing the photo reactive layers 18 and 20 using the second power level 104.

The exemplary device 10 of FIGS. 7-9 includes a top sheet of glass 12 employed as the substrate. In this embodiment, the glass 12 can be referred to as a "superstrate," since it is the substrate on which the subsequent layers are formed, but it faces upwards to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

The transparent conductive oxide (TCO) layer 14 is shown on the glass 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 µm and about 1 µm, for example from about 0.1 µm to about 0.5 µm, such as from about 0.25 µm to about 0.35 µm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square.

The resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 µm and about 1 µm, for example from about 0.1 µm to about 0.5 µm. In particular embodiments, the RTB layer 16 can have a thickness between about 0.08 µm and about 0.2 µm, for example from about 0.1 µm to about 0.15 µm.

The cadmium sulfide layer 18 is shown on resistive transparent buffer layer 16 of the exemplary device 10. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering, either direct current (DC) sputtering or radio frequency (RF) sputtering, on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 µm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 µm reduces any adsorption of radiation energy by the cadmium sulfide layer 18, effectively increasing the amount of radiation energy reaching the underlying cadmium telluride layer 22.

The cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layers 22 and 24. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as $CdO$, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

The back contact is formed from the graphite layer 22 and the metal contact layer 22 shown on the cadmium telluride layer 20 and generally serves as the back electrical contact, in relation to the opposite, TCO layer 14 serving as the front electrical contact. The back contact is formed on, and in one embodiment is in direct contact with, the cadmium telluride layer 20.

The graphite layer 22 can include a polymer blend or a carbon paste and can be applied to the semiconductor device by any suitable method for spreading the blend or paste, such as screen printing, spraying or by a "doctor" blade. After the application of the graphite blend or carbon paste, the device 10 can be heated to convert the blend or paste into the conductive graphite layer 22. The graphite layer 22 can be, in particular embodiments, from about 0.1 µm to about 10 µm in thickness, for example from about 1 µm to about 5 µm.

The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 µm to about 1.5 µm in thickness.

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells, as described above with respect to FIG. 8.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of laser scribing a film stack including a plurality of thin film layers on a substrate, comprising:
   applying a pulse of a laser beam onto the film stack, wherein the laser beam has a power that varies as a function of time during the pulse to complete a predetermined power cycle, wherein the pulse lasts about 0.1 nanoseconds to about 500 nanoseconds; and,
   repeating the pulse of the laser beam across the film stack to form a scribe line, wherein the power cycle has a power level that is adjusted to match properties of individual thin film layers and includes a first power level that is different than a second power level wherein the first power level is configured to scribe a first thin film layer, and wherein the second power level is configured to scribe an underlying second thin film layer.

2. The method as in claim 1, wherein the power of the laser beam remains at the first power level for a first duration that is about 10% to about 90% of the pulse.

3. The method as in claim 2, wherein the first duration is about 20% to about 75% of the pulse.

4. The method as in claim 2, wherein the first duration is about 25% to about 50% of the pulse.

5. The method as in claim 2, wherein the power of the laser beam remains at the second power level for a second duration that is shorter than the first duration, and wherein the first power level is less than the second power level.

6. The method as in claim 5, wherein the second duration is about 0.5% to less than 50% of the pulse.

7. The method as in claim 5, wherein the second duration is about 1% to about 25% of the pulse.

8. The method as in claim 2, wherein the power cycle further defines a third power level that is different than both the first power level and the second power level, wherein the power of the laser beam remains at the third power level for a third duration that is about 0.001% to about 50% of the pulse.

9. The method as in claim 8, wherein the power of the laser beam remains at the third power level for about 0.01% to about 25% of the pulse duration.

10. The method as in claim 8, wherein the first power level is less than both the third power level and the second power level.

11. The method as in claim 10, wherein the third power level is sequentially before the first power level in the power cycle of the pulse, and wherein the first power level is sequentially before the second power level in the power cycle of the pulse.

12. A method of laser scribing a cadmium telluride thin-film based photovoltaic device, the method comprising:
   providing the cadmium telluride thin-film based photovoltaic device, wherein the cadmium telluride thin-film based photovoltaic device comprises a glass superstrate and a film stack, the film stack comprising a transparent conductive oxide layer over the glass superstrate, a resistive transparent buffer layer over the transparent conductive oxide layer, a cadmium sulfide layer over the resistive transparent buffer layer, and a cadmium telluride layer over the cadmium sulfide layer;
   applying a pulse of a laser beam onto the film stack, wherein the laser beam has a power that varies as a function of time during the pulse according to a predetermined power cycle, wherein the pulse lasts about 0.1 nanoseconds to about 500 nanoseconds; and,
   repeating the pulse of the laser beam across the cadmium telluride thin-film based photovoltaic device to form a scribe line in the film stack, wherein the power cycle defines a first power level that is different than a second power level wherein the first power level is configured to scribe a first thin film layer, and wherein the second power level is configured to scribe an underlying second thin film layer.

13. The method as in claim 12, wherein the power of the laser beam remains at the first power level for a first duration that is about 10% to about 90% of the pulse.

14. The method as in claim 13, wherein the first power level is sequentially before the second power level in the power cycle of the pulse.

15. The method as in claim 13, wherein the power of the laser beam remains at the second power level for a second duration that is shorter than the first duration, and wherein the first power level is less than the second power level.

16. The method as in claim 13, wherein the power cycle further defines a third power level that is different than both the first power level and the second power level, wherein the power of the laser beam remains at the third power level for a third duration that is about 0.5% to about 50% of the pulse.

17. The method as in claim 16, wherein the power of the laser beam remains at the third power level for about 1% to about 25% of the pulse duration.

18. The method as in claim 16, wherein the first power level is less than both the third power level and the second power level.

19. The method as in claim 18, wherein the third power level is sequentially before the first power level in the power cycle of the pulse, and wherein the first power level is sequentially before the second power level in the power cycle of the pulse.

* * * * *